(12) United States Patent
Wallace et al.

(10) Patent No.: US 6,468,856 B2
(45) Date of Patent: Oct. 22, 2002

(54) HIGH CHARGE STORAGE DENSITY INTEGRATED CIRCUIT CAPACITOR

(75) Inventors: Robert M. Wallace, Richardson, TX (US); Glen D. Wilk, New Providence, NJ (US); Mark Anthony, Tampa, FL (US); Dim-Lee Kwong, Austin, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/798,329

(22) Filed: Mar. 2, 2001

(65) Prior Publication Data

US 2001/0024853 A1 Sep. 27, 2001

Related U.S. Application Data

(63) Continuation-in-part of application No. 09/115,856, filed on Jul. 15, 1998, now abandoned, and a continuation-in-part of application No. 09/115,855, filed on Jul. 15, 1998
(60) Provisional application No. 60/053,617, filed on Jul. 24, 1997, and provisional application No. 60/053,616, filed on Jul. 24, 1997.

(51) Int. Cl.[7] .......................................... H01L 21/8242
(52) U.S. Cl. ........................................ 438/240; 438/255
(58) Field of Search ................................ 438/238, 240, 438/250, 255, 381, 382, 385, 386, 398, 399, 775

(56) References Cited

U.S. PATENT DOCUMENTS

| 5,318,676 | A | * | 6/1994 | Sailor et al. |
| 5,763,300 | A | * | 6/1998 | Park et al. |
| 6,008,086 | A | * | 12/1999 | Schuegraf et al. |
| 6,012,304 | A | * | 1/2000 | Loxley et al. |
| 6,291,866 | B1 | * | 9/2001 | Wallace et al. |

* cited by examiner

Primary Examiner—David Nelms
Assistant Examiner—Phuc T. Dang
(74) Attorney, Agent, or Firm—Wade James Brady, III; Frederick J. Telecky, Jr.

(57) ABSTRACT

An integrated circuit capacitor comprising a high permittivity dielectric and a method of forming the same are disclosed herein. In one embodiment, this capacitor may be used as a DRAM storage cell. For example, a DRAM storage node electrode 22 may be formed of polysilicon. An ultrathin oxynitride passivation layer 25 (e.g. less than 1 nm) is formed on this electrode by exposure of the substrate to NO. A tantalum pentoxide layer 24 is formed over layer 25, followed by a cell plate 26. Passivation layer 25 allows electrode 22 to resist oxidation during deposition of layer 25, thus preventing formation of an interfacial oxide layer. A passivation layer formed by this method may typically be deposited with shorter exposure times and lower temperatures than nitride passivation layers.

15 Claims, 5 Drawing Sheets

HIGH CHARGE STORAGE DENSITY INTEGRATED CIRCUIT CAPACITOR

RELATED PATENT APPLICATIONS

This invention is related to applications Ser. No. 09/116,138 and Ser. No. 09/115,855 which are incorporated herein by reference. This application is a continuation-in-part of application Ser. No. 09/115,856, filed 17/15/98 which claims priority from Provisional Application Ser. No. 60/053,617, filed Jul. 24, 1997. This application is also a continuation-in-part of application Ser. No. 09/115,855 which claims priority from Provisional Patent Application No. 60/053,616, filed Jul. 24, 1997.

FIELD OF THE INVENTION

This invention relates generally to integrated circuit structures and methods for forming such, and more specifically to such structures and methods related to integrated circuit capacitor structures such as those found in dynamic random access memories.

BACKGROUND OF THE INVENTION

Capacitor structures perform useful functions in a wide variety of integrated circuits. For example, dynamic random access memories (DRAMs) are common integrated circuits, used for storing digital data in computer applications, that make extensive use of integrated capacitors. The core of these circuits consists of rows and columns of DRAM "cells", each cell capable of storing one bit of information. Each DRAM cell contains a storage capacitor and an access transistor. The storage capacitor may be set to either a charged or a discharged state, with the charge storage state representing a "stored" bit of information. This charge storage state may later be read to determine the value set in the DRAM cell.

The amount of charge stored in a charged DRAM cell is related to the specific capacitor design. The minimum charge storage requirement for the DRAM cell storage capacitor is generally driven by the DRAM read circuit's ability to reliably discriminate between the capacitor's charged and uncharged states. As charge storage is directly related to the area of the storage capacitor, a designer wishing to shrink the size of a DRAM cell must therefore compensate for the reduced capacitor area in some manner, or the reduction in charge storage capacity will cause the circuit to operate unreliably. Many different means, some of them very elaborate, have been suggested for maintaining the required charged storage with a smaller capacitor circuit area. These means include trenched and stacked capacitors (which use at least some vertically-integrated charge storage structure to compensate for the decrease in lateral charge storage capability), and capacitors with high permittivity dielectrics.

High permittivity (high-k) dielectrics can compensate for capacitor area reduction, as capacitance is directly proportional to dielectric constant (the dielectric constant of a material is the ratio of the permittivity of the material to the permittivity of free space). Thus, all else being equal, a device with a dielectric constant of 40 can store roughly 10 times the charge of a similar-sized device employing a conventional silicon dioxide dielectric. Unfortunately, substitution of high-k materials for silicon dioxide opens up a host of material compatibility and processing issues. Many of these issues are related to the requirement that most high-k materials must be formed and/or annealed in high-temperature, highly-oxidizing conditions. As such, these materials generally cannot be formed directly over a silicon or other oxidizable electrode without also causing a portion of the electrode to oxidize, thus greatly degrading the capacitive properties of the device.

Many alternative electrode materials have been proposed to avoid the electrode oxidation problem found with high-k material deposition. These range from noble metals that resist oxidation, such as platinum, to conductive oxides that are pre-oxidized, such as ruthenium dioxide, to conductive nitrides that also resist oxidation, such as titanium nitride. Many proposed electrode structures utilize these materials in electrodes comprising multiple layers of dissimilar materials. In general then, alternative electrode materials and processes add complexity and expense to the fabrication process.

As a simpler and less expensive alternative, silicon electrodes (highly doped Si) have been used, e.g., with tantalum pentoxide dielectrics, by forming a thermal silicon nitride barrier layer on the surface of the silicon electrode prior to deposition of tantalum pentoxide. Although this approach is relatively straightforward, it is not without its own problems. Thermal nitridation generally requires temperatures in excess of 900° C., an unattractive requirement at this stage of the fabrication process when other temperature-sensitive circuit devices have already been formed. Also, the nitride must be thick enough to inhibit oxidation of the silicon (generally on the order of 30 Å or more). As silicon nitride has a dielectric constant of only 7, the formation of a 30 Å silicon nitride barrier may severely limit achievable overall dielectric constant even when combined with a high-k dielectric such as tantalum pentoxide.

SUMMARY OF THE INVENTION

The present invention comprises an integrated circuit having a capacitor structure with a high charge storage density, and a method for making the same. The present invention makes possible the economical construction of high-k capacitors with silicon electrodes at relatively low temperature, apparently with minimal formation of interfacial oxide layers that degrade performance. Devices fabricated by the method of the invention have been measured with charge storage capacity comparable to a theoretical device having a silicon dioxide layer only a few monolayers thick.

The present invention avoids formation of silicon dioxide on a silicon electrode during dielectric deposition by initially forming an ultrathin passivation layer on the silicon electrode. In general, this passivation layer is formed by briefly exposing a clean silicon electrode to NO, preferably at 700° C. to 800° C. It is now believed that the resulting silicon oxynitride passivation layer is strongly resistant to further oxidation, even when formed at thicknesses less than 1 nm. Although the passivation layer itself is believed to have a relatively low dielectric constant, because the passivation layer may be made extremely thin it has a relatively small effect on the overall capacitor dielectric constant.

The present invention is believed to have other benefits as well. Because of the relatively low temperatures and short NO exposure times preferred in the invention, other devices on the circuit do not have to withstand a long high-temperature anneal in order to form the passivation layer. Also, the method of passivation layer formation is straightforward and should be applicable to any electrode shape. And, the NO exposure step is believed to result in relatively high nitrogen concentrations in the oxynitride layer, particularly at subnanometer dimensions.

In one aspect of the invention, a method of fabricating an integrated circuit is disclosed that comprises providing a substrate having a silicon electrode with either a bare Si or a hydrogen-terminated Si surface thereon, this surface being substantially unoxidized. This method further comprises forming a silicon oxynitride layer on this surface with an average thickness of less than 1 nm (and more preferably less than 0.5 nm), by exposure to NO. This method further comprises forming an alternative dielectric material layer on the oxynitride layer. The silicon electrode may be either single-crystal silicon or polycrystalline silicon (polysilicon).

Alternative dielectric materials are defined herein to comprise: metal oxides other than silicon dioxide, complex metal oxides, and metal silicates. Most preferably, the alternative dielectric material has: 1) a dielectric constant on the order of 10 or greater, such that the alternative dielectric layer may be formed significantly thicker than a layer of silicon dioxide delivering similar capacitive performance; and 2) a heat of formation that is more negative than the heat of formation of silicon dioxide, which is believed to aid in the formation of a stable dielectric via the method of the invention. Preferable metal oxides include those with metals selected from Groups IIA-VIA (e.g. BaO, $CeO_2$, $HfO_2$, $La_2O_3$, $Nb_2O_5$, $Ta_2O_5$, $TiO_2$, $V_2O_5$, $WO_3$, and $ZrO_2$). Preferable complex metal oxides include those comprising metals selected from Groups IIA-VIA (e.g. $BaTiO_3$, $BaWO_4$, $(Ba,Sr)TiO_3$, $SrTiO_3$, and $SrWO_4$). Preferable metal silicates include those comprising metals selected from Groups IIA-VIA (e.g. $(Al_2O_3,SiO_2)$, $CeSiO_4$, $HfSiO_4$, $LaSiO_4$, $TaSiO_4$, and $ZrSiO_4$). Although such silicates need not be stoichiometric, they are selected to contain both silicon dioxide and metal oxide at significantly greater than incidental impurity levels.

Preferred processing conditions for the step of NO exposure are believed to be optimized by temperatures of between 700° C. and 800° C., with 700° C. being more preferable. Exposure times are preferably within the range of 1 to 100 seconds, with shorter exposure times preferred. NO partial pressure during oxynitride film growth is preferably in the range of 1 to 10 Torr; this may consist of pure NO at this pressure, or NO in an inert carrier gas such as argon.

In another aspect of the invention, an integrated circuit having a capacitor fabricated thereon is disclosed, wherein the capacitor comprises a silicon electrode with a dielectric layer of an alternative dielectric material overlying it. A silicon oxynitride layer having a thickness less than 1 nm and formed by exposure of the silicon electrode to NO is interposed between the electrode and the dielectric layer. A conductive layer may then be formed over the dielectric layer.

BRIEF DESCRIPTION OF THE DRAWINGS

This invention, including the features and advantages thereof, can be best understood by reference to the following drawings, wherein:

FIG. 6a is a cross-sectional view of a DRAM cell that utilizes the present invention and FIG. 6b is an electrical schematic of the structure of FIG. 6a;

DETAILED DESCRIPTION OF THE PREFERRED EMBODIMENTS

Figure 1:
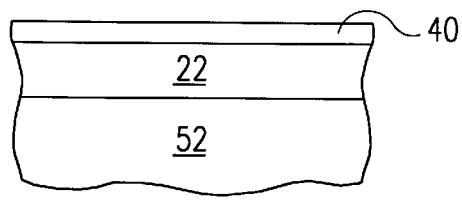
FIGS. 1, 2a, 2b, and 3–5 are cross-sectional views of a integrated circuit capacitor structure during fabrication according to one preferred embodiment of the invention.

One preferred embodiment of the invention may be fabricated using a representative Si(100) substrate, as described herein with reference to FIGS. 1–5. The description of this process begins, as shown in FIG. 1, after formation of an electrode 22 on substrate 52, and assumes that a protective or native silicon oxide region 40 overlies electrode 22 in the region of interest. The electrode may, for example, be formed by ion implantation of the substrate, epitaxial growth, or deposition of a polysilicon layer. Although for many applications electrode 22 will electrically contact the substrate and/or be an integral part thereof, electrode 22 may also be separated from substrate 52 by other conductive or insulating layers. Processes for reaching this step in fabrication are all well-known in the art.

Figure 2A:
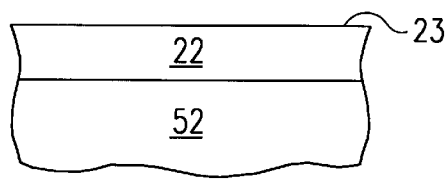
Figure 2B:
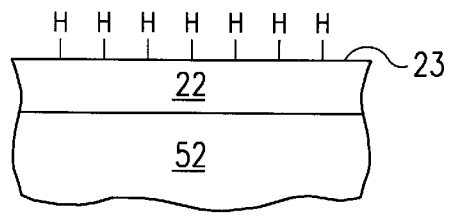

Oxide 40 is removed from electrode 22, leaving either a clean, bare upper surface 23 as shown in FIG. 2a, or a hydrogen-terminated surface 23 as shown in FIG. 2b. The bare surface is preferred if chemical reaction of the highly reactive Si surface can be prevented, e.g. by processing in ultrahigh (less than ~$10^{-8}$ Torr) vacuum or an inert atmosphere (e.g. He, Ar) until after deposition of the oxynitride passivation layer. Otherwise, the bare Si surface should be terminated with a suitable passivant, such as hydrogen, which inhibits reoxidation and yet may be readily removed.

The method of oxide removal is not believed to be critical to the practice of the invention, as long as a clean, oxide-free surface can be maintained until deposition of the oxynitride layer. One preferred method of performing removal of oxide 40 is by exposure to wet HF, for example by dipping the substrate in dilute HF for 30 seconds and rinsing in deionized water. This both removes the native oxide and hydrogen terminates the surface. Another preferred method is by exposure to HF vapor; this provides similar results, but may be used, e.g., in a cluster tool to further prevent reoxidation or contamination of the surface. Either of these approaches may comprise other appropriate stripping chemicals, with HF or a $NH_4F$ solution being preferred as a last step to provide termination.

Several other methods produce a non-terminated surface 23, as shown in FIG. 2a. One such method with particular applicability to cluster-tool practice is Si flux desorption; it has been found that below $10^{-8}$ Torr and at 780° C., an Si flux of preferably 1.5 Å/sec for about 600 seconds not only removes native oxide, but produces an atomically smooth, stepped surface on single-crystal silicon that may be particularly advantageous for ultrathin dielectrics. Alternatives include simple desorption by heating of the substrate to high temperature in vacuum or in an $H_2$ ambient; it is believed, however, that the Si-flux method results in a superior surface structure. In any of these methods, if the substrate is not to be kept in ultrahigh vacuum until oxynitride deposition is begun, surface 23 may be hydrogen terminated, e.g., by exposure to atomic hydrogen produced by a plasma or hot filament in an $H_2$ ambient.

Figure 3:
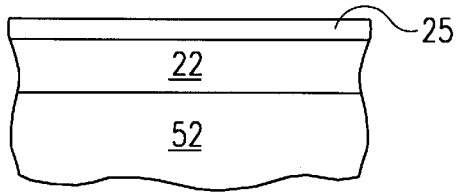

Surface 23 is next subjected to oxynitridation, producing oxynitride passivation layer 25 on silicon electrode 22, as shown in FIG. 3. The preferred method of oxynitridation is by exposure to NO. Oxynitrides produced by other methods are not believed to provide sufficient oxidation resistance at the required thicknesses to complete the capacitor structures disclosed herein, and/or require higher process temperatures, and as such are not preferred. For instance, $N_2O$ processes result in a much smaller incorporation of N than NO processes. $NH_3$ processes require a pre-existing $SiO_2$ film, and thus a uniform sub-nanometer oxynitride film appears to be difficult to achieve using $NH_3$. Additionally, $NH_3$ annealing apparently incorporates undesirable hydrogen into the film structure.

NO oxynitridation requires heating of the substrate. Although oxynitride films have been produced at temperatures between 560° C. and 1150° C. for characterization purposes, the preferred range of exposure temperature is between approximately 700° C. and 800° C. It is believed that higher temperatures and longer exposure times result in less incorporation of nitrogen into the film. Note that the temperatures required for oxynitridation are high enough to remove hydrogen termination from the substrate (i.e. >500° C.), such that hydrogen may be removed in the NO ambient. Optionally, if hydrogen termination is used, it may be removed prior to the introduction of NO by heating the substrate to at least 500° C. in an inert ambient, such as argon, or in vacuum.

Although a wide range of exposure time, temperature, and NO partial pressure variables are available, for the preferred temperature range of 700° C. to 800° C., relatively short exposure times are preferred as this appears to produce films with superior oxidation resistance. Exposure times in the range of 1 to 100 seconds are preferable, with exposure times of 1 to 20 seconds being more preferable. These exposure times are preferably coupled with NO partial pressures of 1 to 10 Torr.

NO exposure may be varied in several ways. First, the substrate may be either ramped to temperature in the NO ambient, or the NO ambient may be introduced after the desired exposure temperature is attained. Short ramp times and longer exposure times are preferred if the NO ambient is introduced before ramping. Second, the NO ambient may be chosen as either NO at reduced pressure, or NO in an inert carrier gas such as argon, at a total pressure that achieves the appropriate partial pressure of NO.

In order to achieve high capacitance for the overall dielectric, the thickness of the completed oxynitride passivation layer should preferably be less than 1 nm. Although the effective dielectric constant of the oxynitride layer is difficult to measure, it is believed to be in the range of 5 to 6. Thicknesses less than 0.5 nm are even more preferred, in order to lessen the effect of the passivation layer's relatively lower dielectric constant on equivalent oxide thickness. Because nitrogen incorporation is believed to be important to the effectiveness of the oxynitride layer as an oxidation barrier, it may be advantageous to post-anneal an NO-formed oxynitride layer in an ambient that provides atomic nitrogen.

Figure 4:
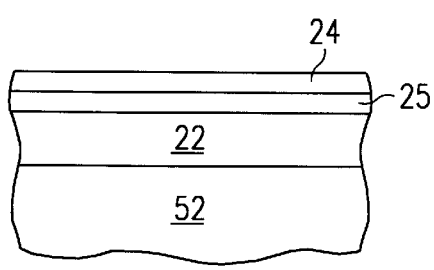

With reference to FIG. 4, once oxynitride passivation layer 25 is completed, an alternative dielectric material capacitor dielectric 24 is deposited onto the substrate. This material preferably has a bulk dielectric constant significantly higher than that of $SiO_2$ (i.e. preferably 10 or greater, and more preferably 25 or greater) such that it may be made relatively thick while allowing for a high charge storage density. The material also preferably has a heat of formation that is more negative than the heat of formation of silicon dioxide, as this is believed to form a more stable capacitor structure. Table 1 lists several candidates for this layer in order of heat of formation, with silicon dioxide included for comparison purposes. Bulk permittivity is also included for several of the materials for comparison purposes; this value may be affected by the thickness of the dielectric layer and by whether the layer is formed as an amorphous or crystalline film.

Because common deposition techniques require the introduction of oxygen at elevated temperature during some stage of processing, it is noted that passivation layer 25 serves the function of preventing oxidation of silicon electrode 22 during deposition of capacitor dielectric 24. If high temperatures (e.g. greater than 600° C.) and highly oxidizing ambients are required for a particular precursor, the oxidation resistance of the passivation film may be compromised to some extent, thus lowering performance. This may be compensated for by increasing the thickness of the oxynitride layer.

TABLE 1

| Material | Bulk Permittivity | Heat of Formation kcal/g/atom of O |
|---|---|---|
| $Y_2O_3$ | 12 | −152 |
| CaO | | −152 |
| MgO | 9.6 | −144 |
| $La_2O_3$ | 30 | −143 |
| SrO | 13 | −142 |
| $Ca_3SiO_5$ | | −138 |
| $Sc_2O_3$ | | −137 |
| $Ca_2SiO_4$ | | −135 |
| $HfO_2$ | 40 | −134 |
| $ZrO_2$ | 25 | −131 |
| $CeO_2$ | 26 | −129 |
| $Al_2O_3$ | 10 | −125 |
| $Ba_2SiO_4$ | | −124 |
| $CaSiO_3$ | | −123 |
| $SrSiO_3$ | | −123 |
| $Mg_2SiO_4$ | | −122 |
| $Na_2SiO_3$ | | −121 |
| $BaSiO_3$ | | −120 |
| $MgSiO_3$ | | −119 |
| $ZrSiO_4$ | 7.1–10.5 | −115 |
| $CeSiO_4$ | | −115 |
| $TiO_2$ | 30 | −110 |
| $SiO_2$ | 3.9 | −103 |
| $Ta_2O_5$ | 26 | −100 |
| ZnO | 4.6 | −84 |
| $WO_3$ | 42 | −66.9 |

Figure 5:
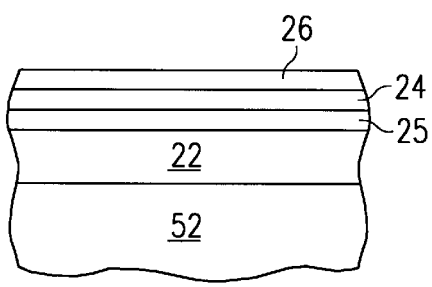

Finally, with reference to FIG. 5, a conductive plate 26 is deposited over dielectric 24. Processes for depositing plate 26 are well known in the art; plate 26 may be formed, by way of example, of doped polysilicon, metal, or a conductive metal oxide. Polysilicon cell plates may require an additional passivation layer (not shown) between dielectric 24 and plate 26 to prevent reduction of dielectric 24 and oxidation of plate 26 at the interface, with a corresponding reduction in performance.

The method and structure of the present invention provide an integrated circuit capacitor that is useful in a wide variety of applications. While the following description is in the context of a DRAM, the present invention can also be used to form a capacitor for an analog-to-digital (A/D) or digital-to-analog (D/A) converter, or most other integrated circuits requiring capacitors. When used in a DRAM, a DRAM array may be asynchronous or synchronous, and the DRAM may comprise a complete integrated circuit or be imbedded in a larger integrated circuit device (e.g. a microprocessor, digital signal processor, microcontroller, other type of memory, or other logic circuitry).

Figure 6A:
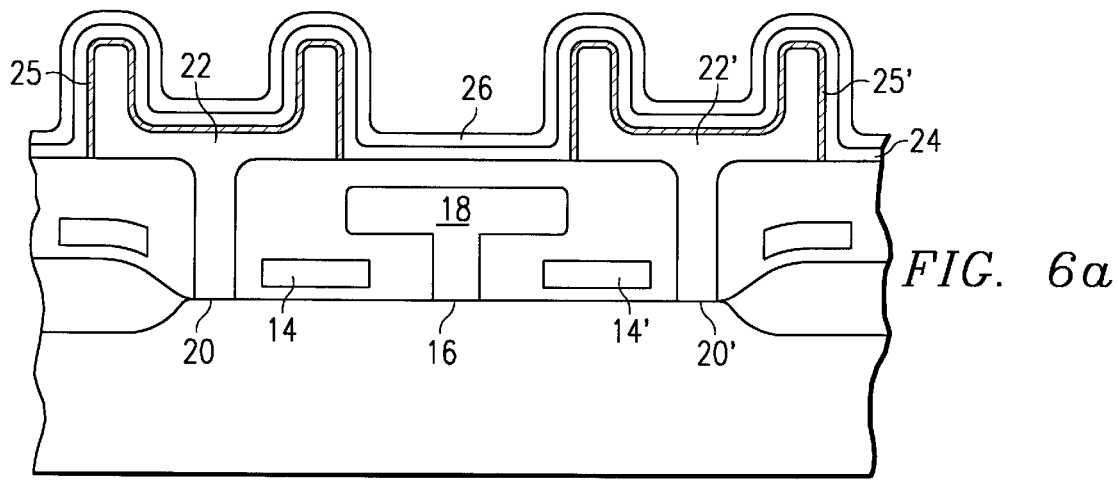
Figure 6B:
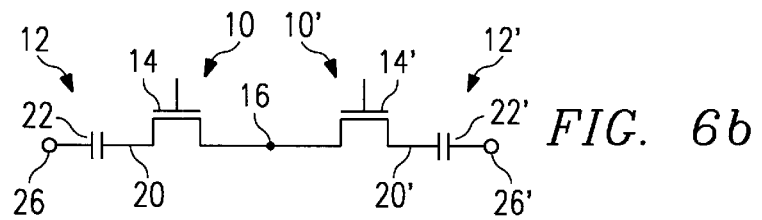

FIG. 6a illustrates a simplified view of two DRAM cells that each utilize a capacitor fabricated according to an embodiment of the present invention. FIG. 6b is a schematic diagram of the DRAM cells of FIG. 6a. As will be clear to those familiar with DRAMs, the cross-section and schematic diagram represent conventional DRAM technology, except for the novel electrode/dielectric capacitor structure incorporated therein.

The left DRAM cell includes a pass transistor 10 coupled in series with a capacitor 12. The gate 14 of pass transistor 10 comprises one of the word lines of a DRAM memory array. A source/drain region 16 of pass transistor 10 (also shared with pass transistor 10') is coupled to bit line 18. The other source/drain region 20 is coupled to the storage node electrode 22 of capacitor 12. Capacitor 12 further includes oxynitride passivation layer 25, dielectric layer 24, and cell plate 26.

An exemplary method of forming a DRAM device will now be described with respect to FIGS. 7a–7j. This method is included to illustrate how the present invention is easily incorporated into a DRAM process flow.

Figure 7A:
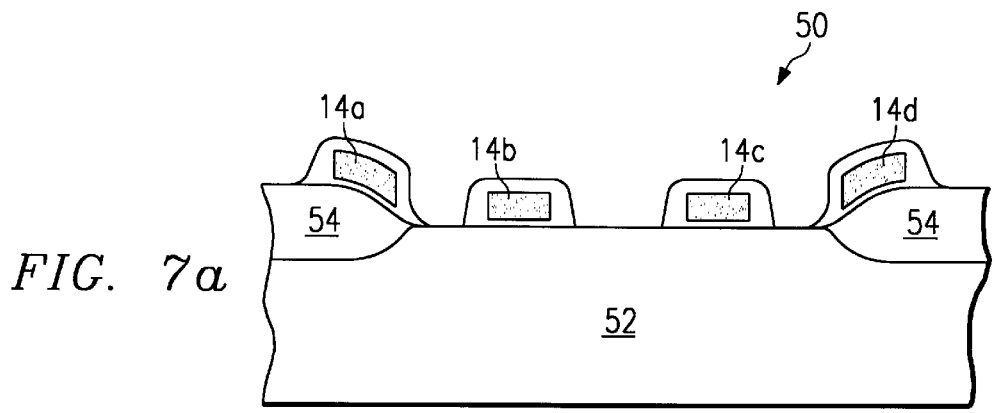
FIGS. 7a–7j are cross-sectional views illustrating one process flow for forming a DRAM cell according to one preferred embodiment of the present invention.

Referring first to FIG. 7a, a DRAM device 50 will be formed in a semiconductor substrate 52. FIG. 7a illustrates field isolation regions 54 and four word line/pass gates 14a–d. While illustrated with field isolation 54, it is also noted that other isolation techniques such as trench isolation can be used. Pass transistors 14b and 14c will form the gates of the two memory cells that will be illustrated in these drawings. Word lines 14a and 14d, on the other hand, will serve as the pass transistors for gates in other rows of the device (not illustrated).

Figure 7B:
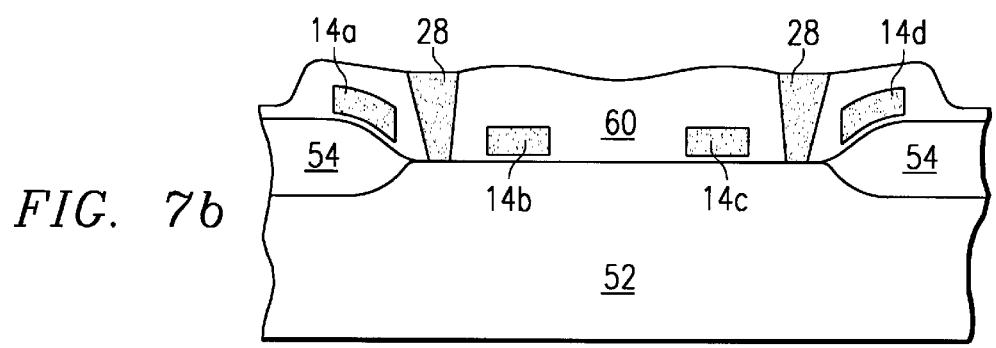

Referring now to FIG. 7b, storage plate plugs 28 are formed. Regions 28 can be formed, for example, by depositing a layer of oxide material 60 over the word lines 14a–d and then etching contact holes through oxide 60. A self-aligned contact etch can be performed by first surrounding each word line 14a–d with a nitride (not illustrated) and etching the overlying oxide 60. Plugs 28 can be formed from polysilicon, metal, conductive silicides, nitrides, or oxides, or combinations of these.

Figure 7C:
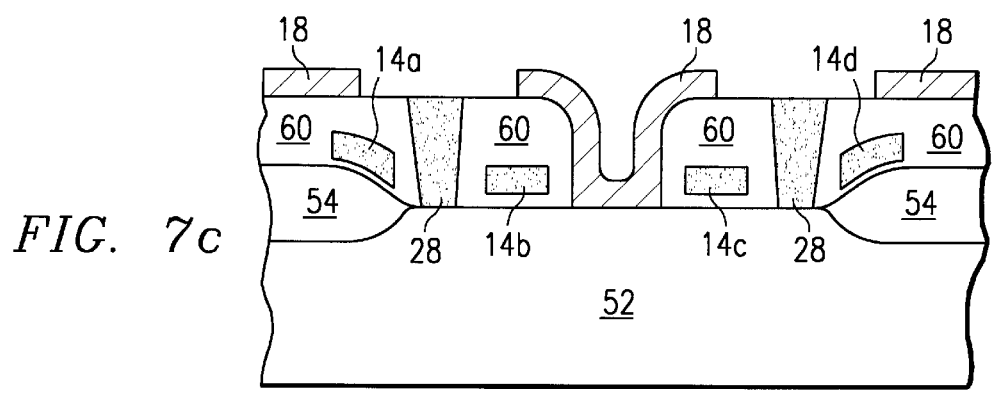

Referring now to FIG. 7c, a bit line region 18 is formed by opening a contact hole in oxide 60 and depositing a conductive material in the opening. While it is not critical to the invention, the bit line may comprise conductive materials such as silicon, metal, or metal silicide.

Figure 7D:
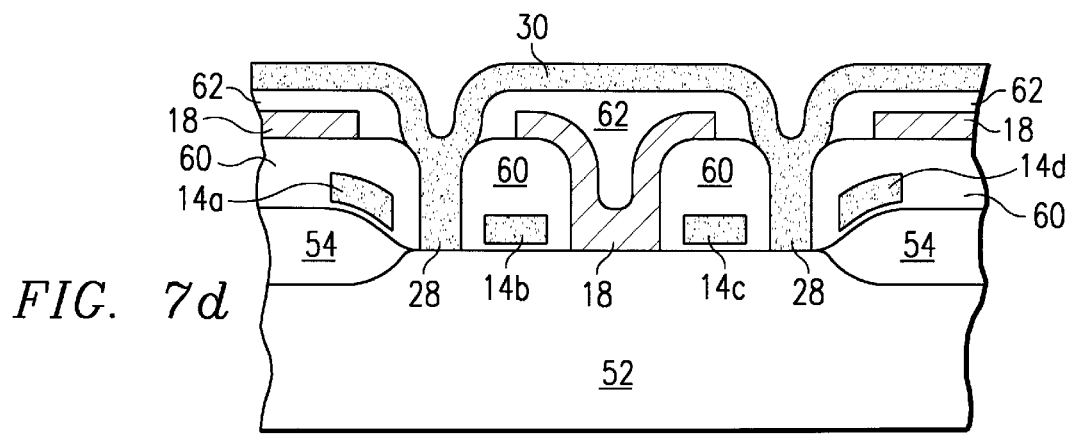

Formation of the storage nodes of the capacitors is continued in FIG. 7d. An insulating layer 62 is formed over bit lines 18. Using standard patterning and etching techniques, a contact hole is formed through insulating layer 62 to expose plug 28. Subsequently, a polysilicon conductive layer 30 is formed over the insulating layer and so as to electrically contact plugs 28.

Figure 7E:
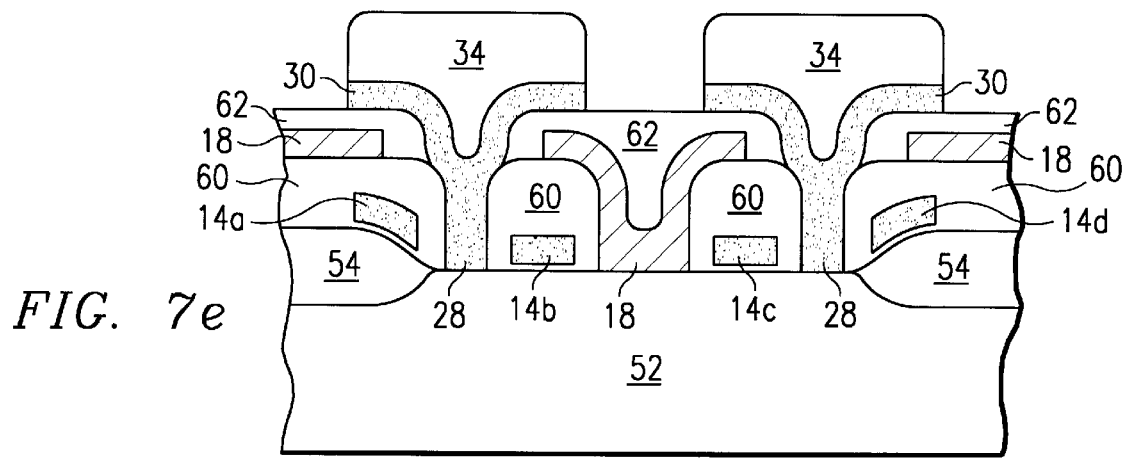

Referring now to FIG. 7e, dummy masking layer 34 is formed over the conductive layer 30. Using standard patterning and etching techniques, masking layer 34 is patterned so as to protect the portion of layer 30 that will become part of storage node 22 (see FIG. 6a). Masking layer 34 and conductive layer 30 are then etched to create a portion of the storage node structure, as shown in FIG. 7e.

Figure 7F:
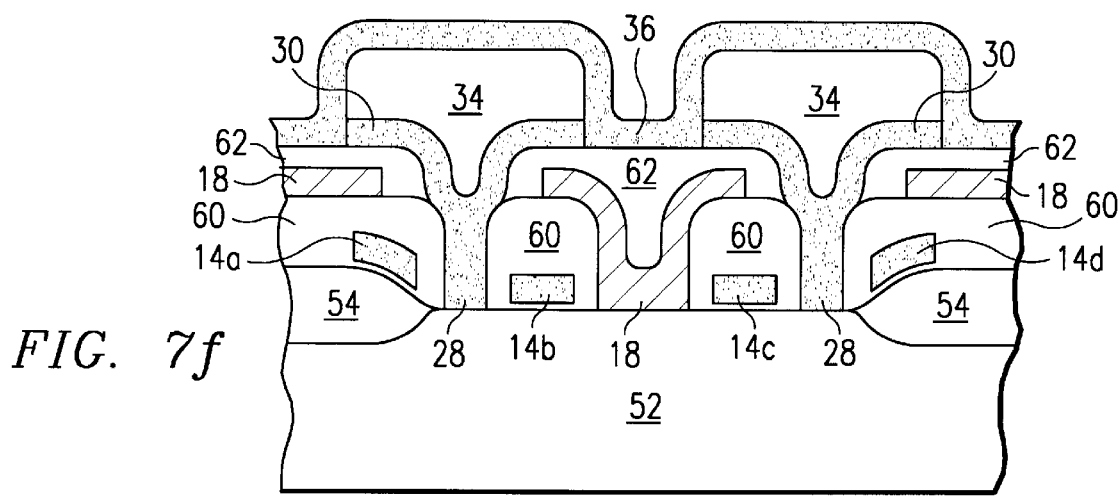
Figure 7G:
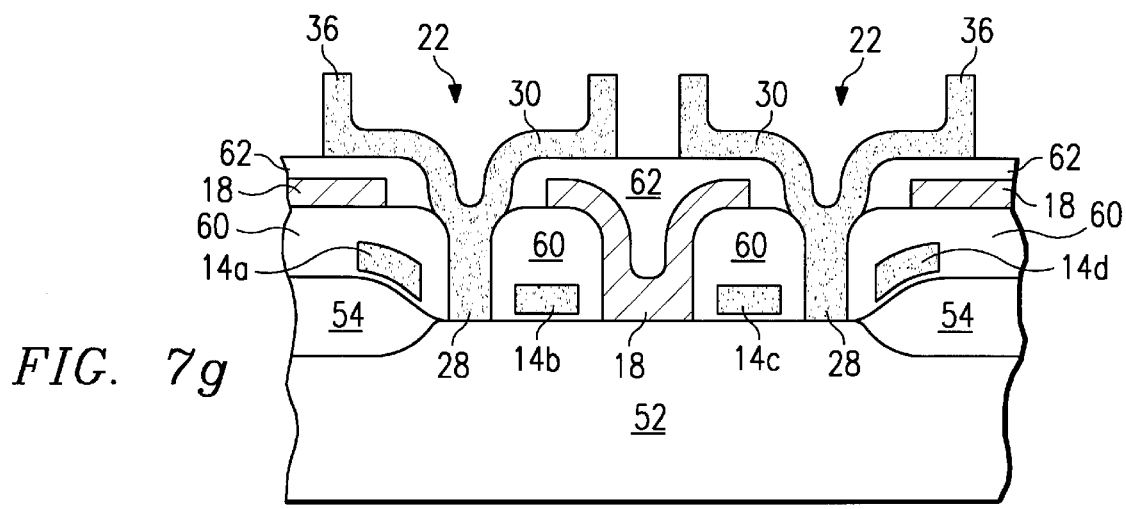

FIG. 7f shows a second polysilicon conductive layer 36 formed over the structure. Layer 36 can then be anisotropically etched so as to leave a sidewall along the dummy layer 34. After dummy layer 34 is removed, a cylindrical storage node 22 will remain as illustrated in FIG. 7g.

Figure 7H:
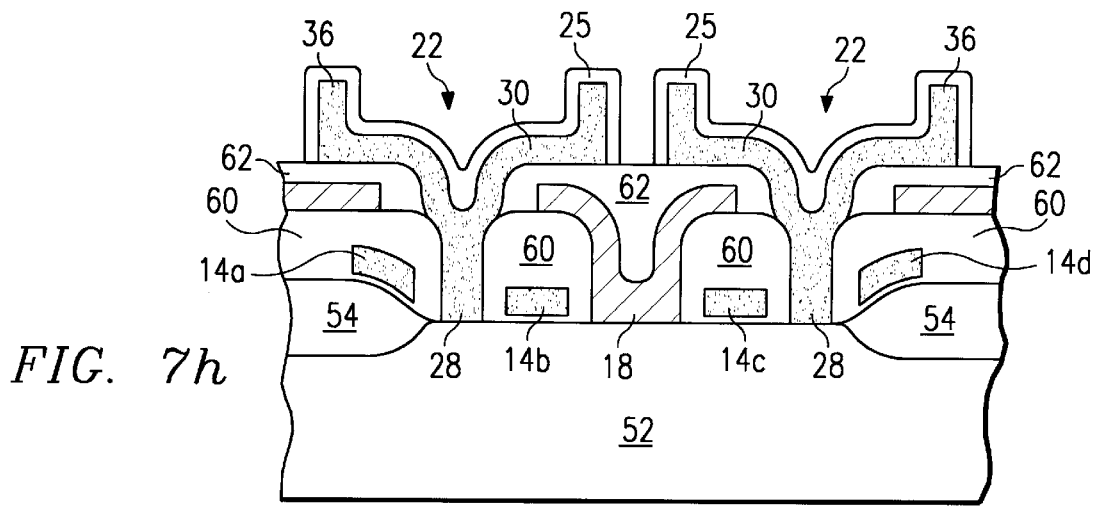

FIG. 7h illustrates cylindrical storage node 22 after formation of oxynitride passivation layer 25. For example, the structure may be cleaned and hydrogen-terminated using HF, and then subjected to NO oxynitridation under the preferred conditions taught in conjunction with FIG. 3 above. It is noted that oxynitride layer 25 should form substantially conformal and uniform in coverage over storage node 22, regardless of the shape of the storage node. It is also noted that exposure to NO should have no deleterious effect on insulating layer 62.

Figure 7I:
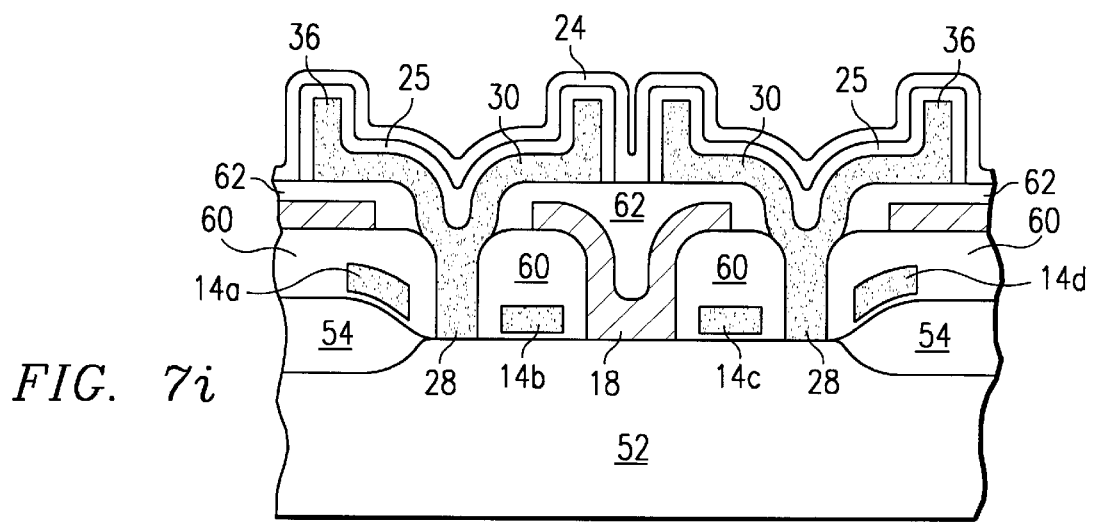
Figure 7J:
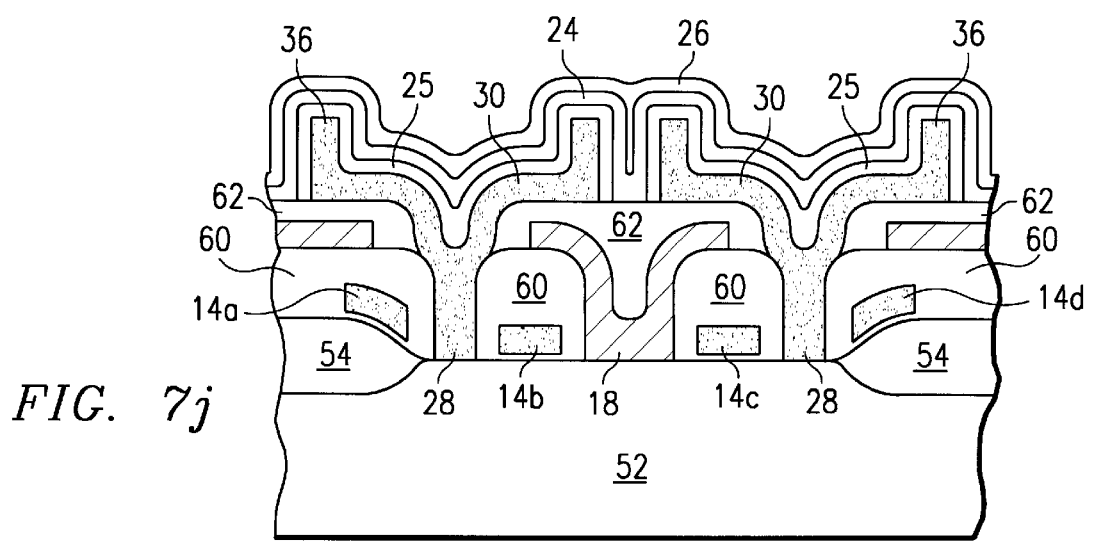

FIG. 7i illustrates the device after deposition of an alternative dielectric material, such as tantalum pentoxide or one of the other materials described with reference to FIG. 4 above, to form dielectric layer 24. Finally, FIG. 7j shows the two DRAM cells after deposition of cell plate 26 over dielectric layer 24. It is noted that a number of additional steps will be required before the DRAM device is completed. Since these steps are not critical to the present invention, they will not be described here beyond the acknowledgment of their existence.

EXAMPLE

A p-type Si(100) substrate was used in this example. The substrate was doped with boron, to a resistivity of 0.01 to 0.02 ?-cm. An epitaxial Si layer was grown on the substrate, boron doped to a resistivity of 11–15 ?-cm.

The substrate was cleaned to remove the pad oxide. As a final step in the cleaning, the substrate was dipped in dilute HF for 30 seconds, and rinsed in deionized water. The substrate was placed in a reaction chamber, which was then evacuated to $3 \times 10^{-8}$ Torr, and then the substrate was heated to 500° C. to remove the hydrogen passivation from the substrate surface. The substrate was then heated to 700° C., and NO at 4 Torr was introduced into the chamber for 10 seconds to form the oxynitride passivation layer.

The substrate was then exposed to $Ta(N(CH_3)_2)_5$ with a partial pressure of 5 Torr, in a carrier gas of $O_2$ at 300 sccm and $N_2$ at 50 sccm, at 700° C. for 10 seconds. An aluminum layer was evaporated at low temperature over this structure, and capacitors with areas ranging from $5 \times 10^{-5}$ cm$^2$ to $1 \times 10^{-3}$ cm$^2$ were patterned.

Figure 8:
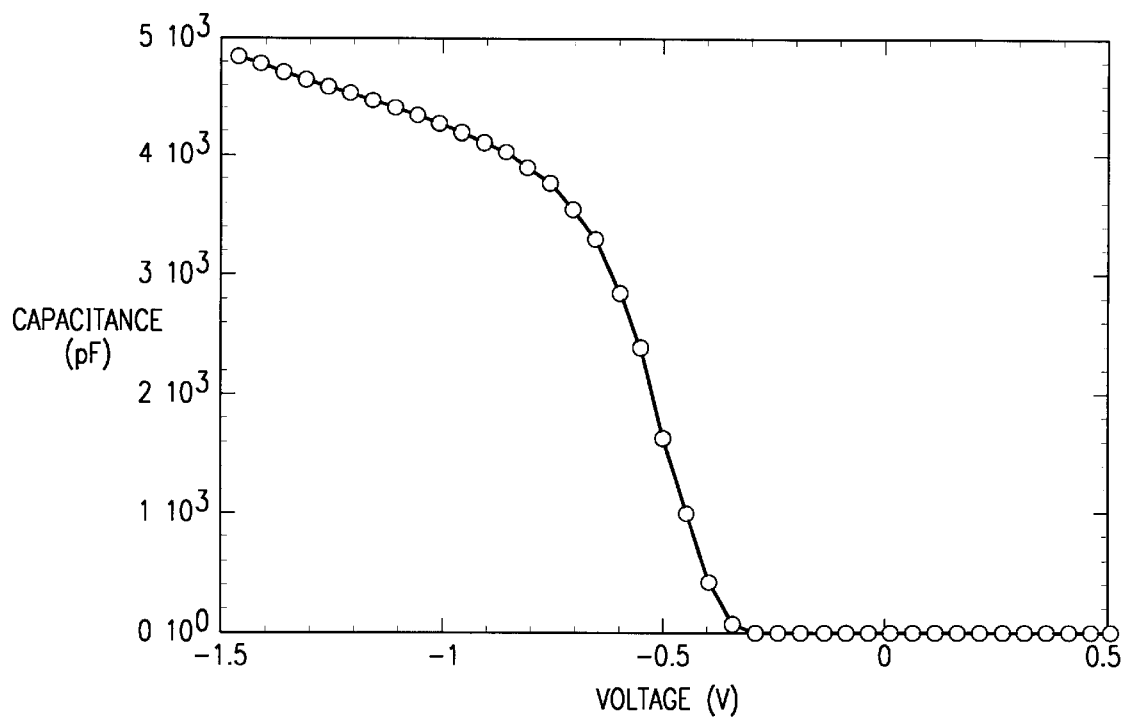
FIGS. 8 and 9 are, respectively, plots of measured capacitance and measured current density versus voltage for an NO-passivated Si electrode/$Ta_2O_5$ dielectric capacitor device according to one preferred embodiment of the invention.
Figure 9:
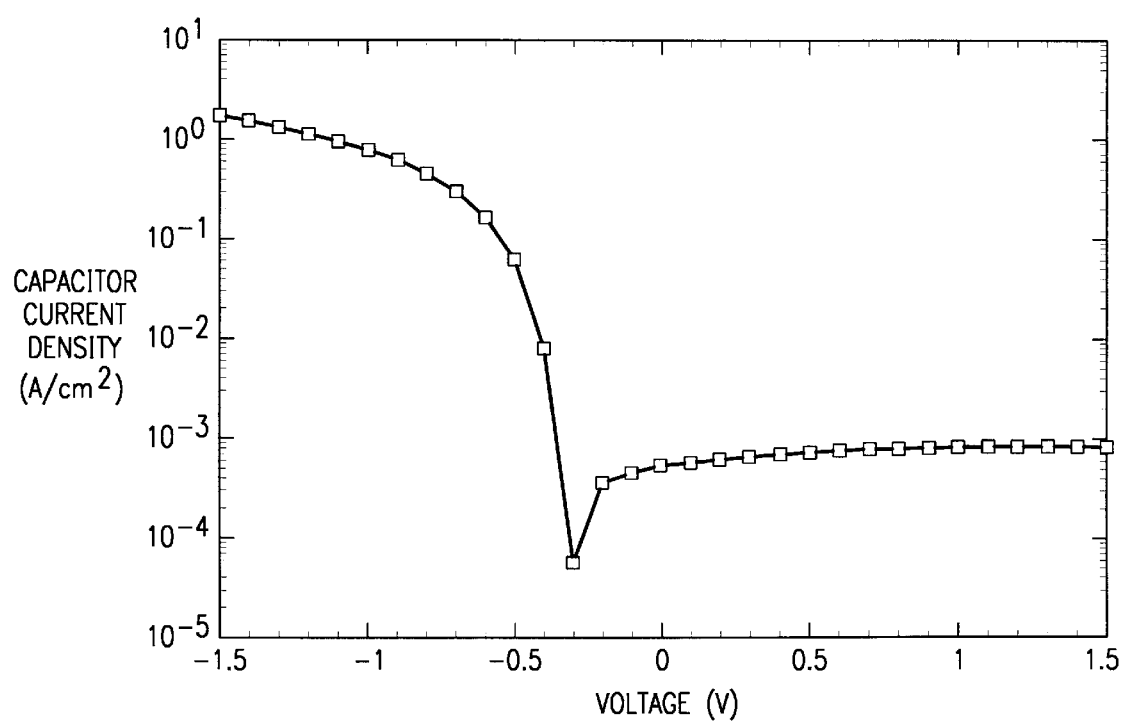

Electrical characteristics of the devices were measured as a function of voltage. FIG. 8 shows measured capacitance as voltage was varied from −1.5 V to 1.5 V. These values indicate an equivalent oxide thickness of less than 3.6 Å. FIG. 9 shows capacitor current density for the same values of voltage. It is believed that current density may be strongly affected by the thickness of the tantalum pentoxide layer.

Although one objective of the alternative dielectric deposition technique described herein is to preferably limit oxygen exposure of the silicon electrode, many other methods of alternative dielectric deposition may be used in the present invention, depending on the topography of the electrode structure. For example, oxides and silicates may be sputtered or co-sputtered from several targets to produce a desired material mixture. Metal may also be sputtered directly and subsequently oxidized.

The present invention is not limited by the specific embodiments described herein. Many other dielectrics may benefit from the ultrathin oxidation barrier described herein. Although a particular substrate and type of device have been described herein for clarity, this invention has application to integrated circuit devices in general. Also, other methods of preventing oxidation of the substrate prior to oxynitridation may be used with similar results. Various modifications and combinations of the illustrative embodiments, as well as other embodiments of this invention, will be apparent to those skilled in the art upon reading this description, and such are intended to be encompassed in the invention.

We claim:

1. A method of fabricating an integrated circuit comprising a capacitor, comprising the steps of:

providing a substrate having a silicon electrode with an exposed Si surface thereon, said exposed surface being substantially unoxidized;

exposing said Si surface to NO, thereby forming a silicon oxynitride layer on said Si surface, said silicon oxynitride layer having an average thickness of less than 1 nm; and forming an alternative dielectric material dielectric layer on said silicon oxynitride layer.

2. The method of claim 1, wherein said exposing said Si surface to NO step comprises exposing said Si surface to NO at a partial pressure of 1 to 10 Torr for 1 to 100 seconds at one or more temperatures between 700° C. and 800° C.

3. The method of claim 1, wherein said exposing said Si surface to NO step comprises exposing said Si surface to substantially pure NO at a total pressure of approximately 4 Torr for approximately 10 seconds at a temperature of approximately 700° C.

4. The method of claim 1, wherein said alternative dielectric material has a heat of formation more negative than the heat of formation of silicon dioxide.

5. The method of claim 1, wherein said forming an alternative dielectric material dielectric layer step comprises forming a tantalum pentoxide layer.

6. The method of claim 5, wherein said forming a tantalum pentoxide layer step comprises exposing said substrate to $Ta(N(CH_3)_2)_5$ at a partial pressure of 1 to 5 Torr at one or more temperatures between 400° C. and 700° C. in a carrier gas selected from the group consisting of $O_2$, $N_2$, and combinations thereof.

7. The method of claim 1, wherein said silicon electrode comprises single-crystal silicon.

8. The method of claim 1, wherein said silicon electrode comprises polysilicon.

9. The method of claim 1, wherein the step of providing a substrate having a silicon electrode comprises the steps of:

providing a substrate having a silicon electrode with a silicon oxide layer deposited thereon;

removing said oxide layer by a method selected from the group consisting of
  exposing said substrate to wet HF,
  exposing said substrate to HF vapor,
  exposing said substrate to an Si flux at a temperature greater than 700° C., and heating said substrate to desorb said silicon oxide layer; and preventing reoxidation of said silicon electrode prior to said exposing said Si surface to NO step.

10. The method of claim 9, wherein said preventing reoxidation step comprises passivating said Si surface with hydrogen.

11. The method of claim 9, wherein said preventing reoxidation step comprises maintaining said substrate in ultrahigh vacuum.

12. A method of fabricating an integrated circuit comprising a capacitor, comprising the steps of:

providing a substrate having a silicon electrode with a protective layer deposited thereon;

removing said protective layer, thereby exposing an Si surface on said electrode;

exposing said Si surface to NO under time and temperature conditions sufficient to produce a silicon oxynitride layer on said Si surface, said silicon oxynitride layer having an average thickness of less than 1 nm; and forming an alternative dielectric material dielectric layer on said silicon oxynitride layer.

13. The method of claim 12, further comprising after said removing said protective layer step, passivating said Si surface with hydrogen, and prior to or concurrent with said exposing step, removing said hydrogen from said Si surface.

14. A method of fabricating an integrated circuit comprising a capacitor comprising the steps of:

providing a substrate having a silicon electrode with a protective layer deposited thereon;

removing said protective layer, thereby exposing an Si surface on said electrode;

exposing said Si surface to NO at a partial pressure of 1 to 10 Torr for 1 to 100 seconds at one or more temperatures between 700° C. and 800° C., thereby forming a silicon oxynitride layer on said Si surface having an average thickness of less than 1 nm; and forming an alternative dielectric material dielectric layer on said silicon oxynitride layer.

15. An integrated circuit made by the method of claim 1.

* * * * *